United States Patent
Lu et al.

(10) Patent No.: US 12,408,408 B2
(45) Date of Patent: Sep. 2, 2025

(54) ELECTROSTATIC DISCHARGE PROTECTION DEVICE INCLUDING SOURCE SILICIDE PATTERN AND DRAIN SILICIDE PATTERN

(71) Applicant: UNITED MICROELECTRONICS CORP., Hsin-Chu (TW)

(72) Inventors: Kuan-Yu Lu, Nantou County (TW); Hou-Jen Chiu, Taichung (TW); Mei-Ling Chao, Tainan (TW); Tien-Hao Tang, Hsinchu (TW); Kuan-Cheng Su, Taipei (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 45 days.

(21) Appl. No.: 17/719,351

(22) Filed: Apr. 12, 2022

(65) Prior Publication Data
US 2023/0299158 A1    Sep. 21, 2023

(30) Foreign Application Priority Data
Mar. 18, 2022    (CN) .......................... 202210270967.6

(51) Int. Cl.
*H10D 89/60*    (2025.01)
*H01L 23/522*    (2006.01)
(Continued)

(52) U.S. Cl.
CPC ....... *H10D 64/258* (2025.01); *H01L 23/5226* (2013.01); *H10D 89/811* (2025.01); *H10D 30/603* (2025.01)

(58) Field of Classification Search
CPC ............ H01L 27/0266; H01L 29/7835; H01L 29/665; H01L 21/76897; H01L 29/41775; H01L 29/1087; H01L 29/41758; H01L 27/0292; H01L 29/7845; H01L 29/4933; H01L 23/5226; H10D 64/258; H10D 89/811; H10D 30/603; H10F 77/215
(Continued)

(56) References Cited

U.S. PATENT DOCUMENTS

| | | | |
|---|---|---|---|
| 8,648,421 B2 | 2/2014 | Wen | |
| 2005/0167739 A1* | 8/2005 | Kogami | ................ H01L 29/665 257/E29.116 |

(Continued)

*Primary Examiner* — David Chen
(74) *Attorney, Agent, or Firm* — Winston Hsu

(57) ABSTRACT

An electrostatic discharge (ESD) protection device includes a semiconductor substrate, a gate structure, a source doped region, a drain doped region, source silicide patterns, and drain silicide patterns. The gate structure is disposed on the semiconductor substrate. The source doped region and the drain doped region are disposed in the semiconductor substrate and located at two opposite sides of the gate structure in a first direction, respectively. The source silicide patterns are disposed on the source doped region. The source silicide patterns are arranged in a second direction and separated from one another. The drain silicide patterns are disposed on the drain doped region. The drain silicide patterns are arranged in the second direction and separated from one another. The source silicide patterns and the drain silicide patterns are arranged misaligned with one another in the first direction.

14 Claims, 9 Drawing Sheets

(51) Int. Cl.
*H10D 64/23* (2025.01)
*H10D 30/60* (2025.01)

(58) Field of Classification Search
USPC ............... 257/355, 360, 361, 362, 363, 384,
257/E29.014, E29.255; 438/151, 592,
438/666
See application file for complete search history.

(56) References Cited

U.S. PATENT DOCUMENTS

| | | | |
|---|---|---|---|
| 2005/0250263 A1* | 11/2005 | Liu ..................... | H01L 27/1203 |
| | | | 438/151 |
| 2006/0170054 A1* | 8/2006 | Mergens ............... | H01L 27/027 |
| | | | 257/355 |
| 2007/0090431 A1* | 4/2007 | Erstad ................ | H10D 30/0221 |
| | | | 257/297 |
| 2007/0205465 A1* | 9/2007 | Yabu ................. | H01L 21/28518 |
| | | | 438/303 |
| 2008/0054371 A1* | 3/2008 | Beyer .................. | H01L 29/665 |
| | | | 257/E21.619 |
| 2008/0210978 A1* | 9/2008 | Yabu .................... | H01L 27/088 |
| | | | 257/E27.06 |
| 2008/0265330 A1* | 10/2008 | Gerhardt ............. | H01L 29/7842 |
| | | | 257/E29.12 |
| 2011/0233677 A1* | 9/2011 | Yamamoto ........... | H01L 27/027 |
| | | | 257/E27.06 |
| 2016/0268417 A1* | 9/2016 | Miyake ............. | H01L 29/41733 |
| 2018/0166438 A1* | 6/2018 | Linewih ............. | H10D 30/0221 |
| 2021/0091070 A1* | 3/2021 | Tang ..................... | H01L 29/665 |

* cited by examiner

ELECTROSTATIC DISCHARGE PROTECTION DEVICE INCLUDING SOURCE SILICIDE PATTERN AND DRAIN SILICIDE PATTERN

BACKGROUND OF THE INVENTION

1. Field of the Invention

The present invention relates to an electrostatic discharge protection device, and more particularly, to an electrostatic discharge protection device including a source silicide pattern and a drain silicide pattern.

2. Description of the Prior Art

Electrostatic discharge (ESD) is an effect in which an electric charge moves rapidly (discharge) in a short period of time through a discharge path after accumulating on a non-conductor or an ungrounded conductor. Electrostatic discharge damages the circuit formed by the components of an integrated circuit. Generally, the human body, machines used to package integrated circuits, and instruments for testing integrated circuits are all common charged bodies, and when a charged body comes in contact with a chip, the charged body may discharge to the chip. The instantaneous power of the electrostatic discharge may cause damage or failure to the integrated circuit in the chip. Therefore, ESD protection structures may be disposed in the integrated circuits for improving the problems described above.

SUMMARY OF THE INVENTION

An electrostatic discharge (ESD) protection device is provided in the present invention. Source silicide patterns and drain silicide patterns arranged misaligned with one another and/or source contact structures and drain contact structures arranged misaligned with one another may be used to increase the distance between a gate structure and the silicide patterns and/or the contact structures. ESD capability and electrical over stress (EOS) capability may be enhanced accordingly, and/or an area occupied by the ESD protection device may be reduced relatively.

An electrostatic discharge protection device is provided in an embodiment of the present invention. The electrostatic discharge protection device includes a semiconductor substrate, a gate structure, a source doped region, a drain doped region, source silicide patterns, and drain silicide patterns. The gate structure is disposed on the semiconductor substrate. The source doped region and the drain doped region are disposed in the semiconductor substrate and located at two opposite sides of the gate structure in a first direction, respectively. The source silicide patterns are disposed on the source doped region, and the source silicide patterns are arranged in a second direction and separated from one another. The drain silicide patterns are disposed on the drain doped region, and the drain silicide patterns are arranged in the second direction and separated from one another. The source silicide patterns and the drain silicide patterns are arranged misaligned with one another in the first direction.

An electrostatic discharge protection device is provided in an embodiment of the present invention. The electrostatic discharge protection device includes a semiconductor substrate, a gate structure, a source doped region, a drain doped region, at least one source silicide pattern, at least one drain silicide pattern, first contact structures, and second contact structures. The gate structure is disposed on the semiconductor substrate. The source doped region and the drain doped region are disposed in the semiconductor substrate and located at two opposite sides of the gate structure in a first direction, respectively. The source silicide pattern is disposed on the source doped region. The drain silicide pattern is disposed on the drain doped region. The first contact structures are disposed on the source silicide pattern, and the first contact structures are arranged in a second direction and separated from one another. The second contact structures are disposed on the drain silicide pattern, and the second contact structures are arranged in the second direction and separated from one another. The first contact structures and the second contact structures are arranged misaligned with one another in the first direction.

These and other objectives of the present invention will no doubt become obvious to those of ordinary skill in the art after reading the following detailed description of the preferred embodiment that is illustrated in the various figures and drawings.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the present invention.

Before the further description of the preferred embodiment, the specific terms used throughout the text will be described below.

The terms "on," "above," and "over" used herein should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

The ordinal numbers, such as "first", "second", etc., used in the description and the claims are used to modify the elements in the claims and do not themselves imply and represent that the claim has any previous ordinal number, do not represent the sequence of some claimed element and another claimed element, and do not represent the sequence of the manufacturing methods, unless an addition description is accompanied. The use of these ordinal numbers is only used to make a claimed element with a certain name clear from another claimed element with the same name.

The term "forming" or the term "disposing" are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 1:
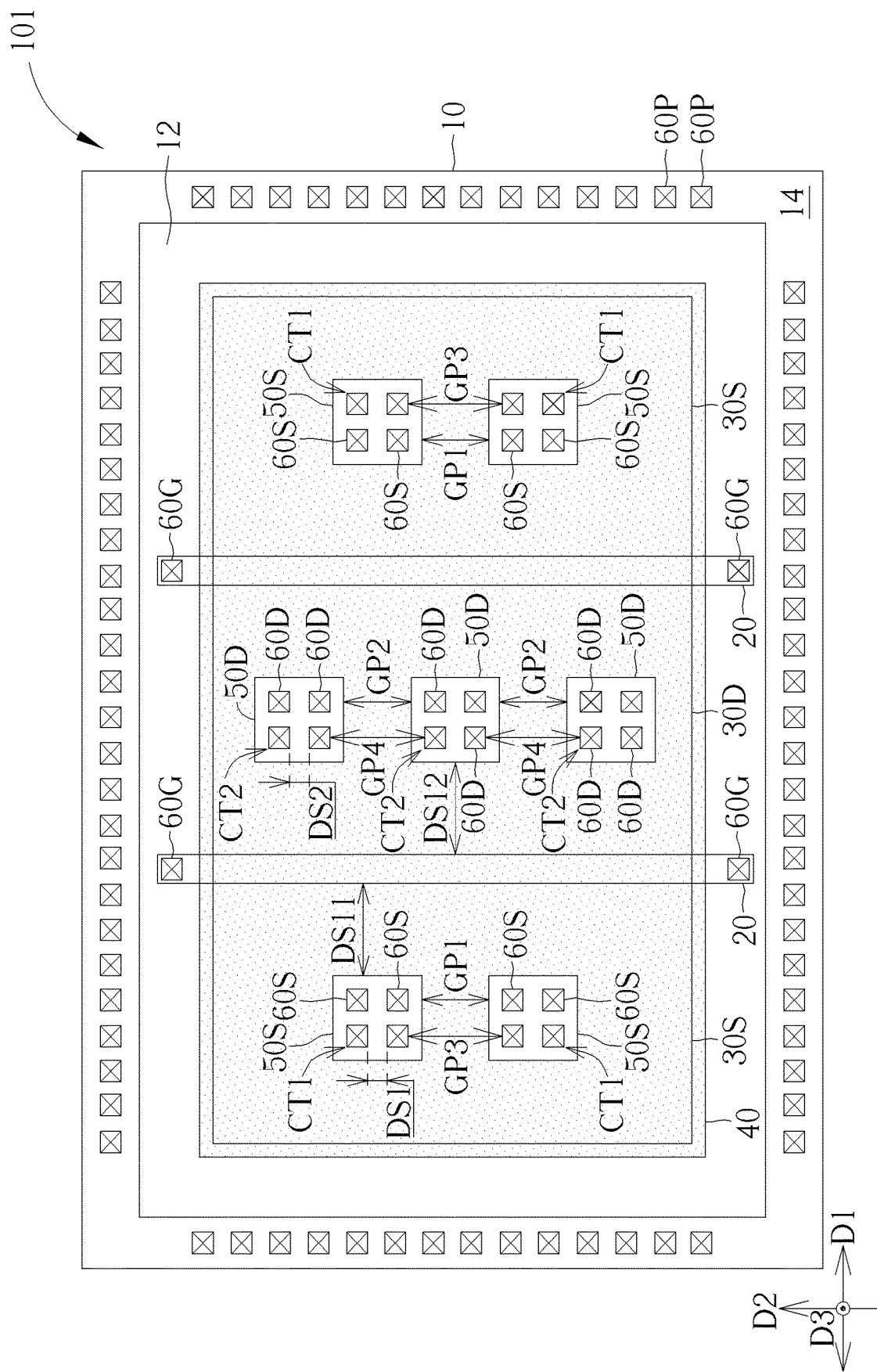
FIG. 1 is a schematic drawing illustrating an electrostatic discharge protection device according to a first embodiment of the present invention.

Please refer to FIG. 1. FIG. 1 is a schematic drawing illustrating an electrostatic discharge (ESD) protection device 101 according to a first embodiment of the present invention. As shown in FIG. 1, the ESD protection device 101 includes a semiconductor substrate 10, at least one gate structure 20, at least one source doped region 30S, at least one drain doped region 30D, at least one source silicide pattern 50S, at least one drain silicide pattern 50D, at least one first contact structure CT1, and at least one second contact structure CT2. The gate structure 20 is disposed on the semiconductor substrate 10. The source doped region 30S and the drain doped region 30D are disposed in the semiconductor substrate 10 and located at two opposite sides of the gate structure 20 in a first direction (such as a direction D1 shown in FIG. 1), respectively. The source silicide pattern 50S is disposed on the source doped region 30S, and the drain silicide pattern 50D is disposed on the drain doped region 30D. The first contact structure CT1 is disposed on the source silicide pattern 50S, and the second contact structure CT2 is disposed on the drain silicide pattern 50D.

In some embodiments, the ESD protection device 101 may include a plurality of the source silicide patterns 50S and a plurality of the drain silicide patterns 50D, but not limited thereto. The source silicide patterns 50S may be disposed on the source doped region 30S in a vertical direction (such as a direction D3 shown in FIG. 1), the drain silicide patterns 50D may be disposed on the drain doped region 30D in the direction D3, and the direction D3 may be regarded as a thickness direction of the semiconductor substrate 10. In addition, the source silicide patterns 50S may be arranged in a second direction (such as a direction D2 shown in FIG. 1) and separated from one another, and the drain silicide patterns 50D may be arranged in the direction D2 and separated from one another also. The source silicide patterns 50S and the drain silicide patterns 50D may be arranged misaligned with one another in the direction D1. In other words, each of the source silicide patterns 50S is not aligned with any one of the drain silicide patterns 50D in the direction D1, and each of the drain silicide patterns 50D is not aligned with any one of the source silicide patterns 50S in the direction D1.

In some embodiments, the ESD protection device 101 may include a plurality of the first contact structures CT1 and a plurality of the second contact structures CT2, but not limited thereto. The first contact structures CT1 may be disposed on the source silicide patterns 50S, respectively, and the second contact structures CT2 may be disposed on the drain silicide patterns 50D, respectively, but not limited thereto. In addition, the first contact structures CT1 may be arranged in the direction D2 and separated from one another, and the second contact structures CT2 may be arranged in the direction D2 and separated from one another. In some embodiments, each of the first contact structures CT1 may be disposed on one of the source silicide patterns 50S in the direction D3, and each of the second contact structures CT2 may be disposed on one of the drain silicide patterns 50D in the direction D3. In other words, there may be only one first contact structure CT1 disposed on each source silicide pattern 50S, and there may be only one second contact structure CT2 disposed on each drain silicide pattern 50D, but not limited thereto. Additionally, the first contact structures CT1 and the second contact structures CT2 may be arranged misaligned with one another in the direction D1. In other words, each of the first contact structures CT1 is not aligned with any one of the second contact structures CT2 in the direction D1, and each of the second contact structures CT2 is not aligned with any one of the first contact structures CT1 in the direction D1.

Specifically, in some embodiments, the direction D3 described above may be regarded as a thickness direction of the semiconductor substrate 10, the semiconductor substrate 10 may have a top surface and a bottom surface opposite to the top surface in the direction D3, and the gate structure 20, the first contact structures CT1, and the second contact structures CT2 described above may be disposed at a side of the top surface. Additionally, in some embodiments, the direction D1 may be substantially orthogonal to the direction D2, and the direction D1 and the direction D2 may be substantially orthogonal to the direction D3 respectively. Therefore, the direction D1 and the direction D2 may be regarded as horizontal directions parallel with the top surface and/or the bottom surface of the semiconductor substrate 10, but not limited thereto. In this description, a distance between the bottom surface of the semiconductor substrate 10 and a relatively higher location and/or a relatively higher part in the direction D3 is greater than a distance between the bottom surface of the semiconductor substrate 10 and a relatively lower location and/or a relatively lower part in the direction D3. The bottom or a lower portion of each component may be closer to the bottom surface of the semiconductor substrate 10 in the direction D3 than the top or upper portion of this component. Another component disposed above a specific component may be regarded as being relatively far from the bottom surface of the semiconductor substrate 10 in the direction D3, and another component disposed under a specific component may be regarded as being relatively closer to the bottom surface of the semiconductor substrate 10 in the direction D3.

In some embodiments, two of the source silicide patterns 50S located adjacent to each other in the direction D2 may be separated from each other by a gap GP1, and two of the drain silicide patterns 50D located adjacent to each other in the direction D2 may be separated from each other by a gap GP2. In other words, there is not any silicide pattern disposed in the gap GP1, and there is not any silicide pattern disposed in the gap GP2 also. In addition, because the source silicide patterns 50S and the drain silicide patterns 50D are arranged misaligned with one another in the direction D1, one of the drain silicide patterns 50D may overlap the gap GP1 when viewed in the direction D1 and/or be aligned with the gap GP1 in the direction D1, and one of the source silicide patterns 50S may overlap the gap GP2 when viewed in the direction D1 and/or be aligned with the gap GP2 in the direction D1. It is worth noting that, in this description, when two objects overlap in a specific direction, it can be considered that when the two objects are viewed in the specific direction, at least some regions of the two objects overlap each other. In some embodiments, in a top view diagram of the ESD protection device 101 (such as FIG. 1), a length of the gap GP1 in the direction D2 may be substantially equal to a length of the gap GP2 in the direction D2. For instance, the length of the gap GP1 in the direction D2 may be substantially equal to the length of the gap GP2 in the direction D2 with a tolerance of ±10% or a tolerance of ±5%. An area of each of the source silicide patterns 50S may be substantially equal to an area of each of the drain silicide patterns 50D. For instance, the area of each of the source silicide patterns 50S in the direction D3 may be substantially equal to the area of each of the drain silicide patterns 50D in the direction D3 with a tolerance of ±10% or a tolerance of ±5%, but not limited thereto. In other words, the dimension of each of the source silicide patterns 50S may be substantially the same as that of each of the drain silicide patterns 50D, and the arrangement pitch of the source silicide patterns 50S in the direction D2 may be substantially equal to that of the drain silicide patterns 50D in the direction D2, but not limited thereto.

In some embodiments, each of the first contact structures CT1 may include one or a plurality of source contacts 60S disposed on the corresponding source silicide patterns 50S, and the source contacts 60S may be separated from one another without being connected with one another. Each of the second contact structures CT2 may include one or a plurality of drain contacts 60D disposed on the corresponding drain silicide patterns 50D, and the drain contacts 60D may be separated from one another without being connected with one another. In some embodiments, each of the first contact structures CT1 may consist of one source contact 60S or a plurality of the source contacts 60S, and each of the second contact structures CT2 may consist of one drain contact 60D or a plurality of the drain contacts 60D, but not limited thereto. For example, in some embodiments, each of the first contact structures CT1 may include four source contact 60S arranged in an array configuration and separated from one another, and each of the second contact structures CT2 may include four drain contact 60D arranged in an array configuration and separated from one another, but not limited thereto.

Figure 2:
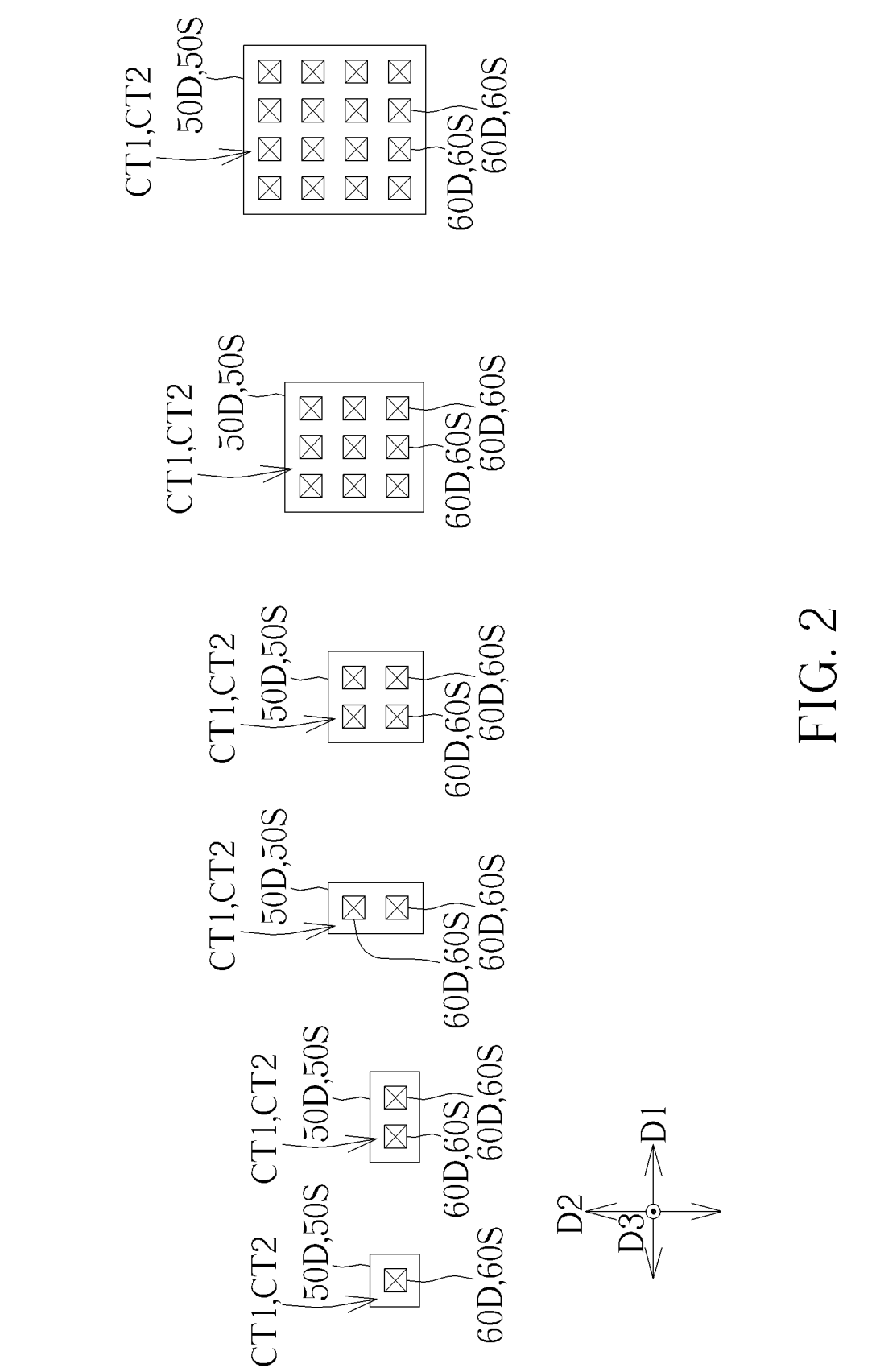
FIG. 2 is a schematic drawing illustrating first contact structures and second contact structures according to some embodiments of the present invention.

Please refer to FIG. 1 and FIG. 2. FIG. 2 is a schematic drawing illustrating the first contact structures and the second contact structures according to some embodiments of the present invention. As shown in FIG. 1 and FIG. 2, in some embodiments, each of the first contact structures CT1 may include one or a plurality of source contacts 60S, and each of the second contact structures CT2 may include one or a plurality of drain contacts 60D. The source contacts 60S in each of the first contact structures CT1 may be arranged and disposed uniformly on the corresponding source silicide pattern 50S with substantially the same spacing therebetween, and the drain contacts 60D in each of the second contact structures CT2 may be arranged and disposed uniformly on the corresponding drain silicide pattern 50D with substantially the same spacing therebetween, but not limited thereto. Additionally, the dimensions and/or the shapes of the source silicide patterns 50S and the drain silicide patterns 50D may be adjusted in accordance with the numbers and/or the arrangements of the source contacts 60S in the first contact structure CT1 and the drain contacts 60D in the second contact structure CT2.

As shown in FIG. 1, in some embodiments, two of the first contact structures CT1 located adjacent to each other in the direction D2 may be separated from each other by a gap GP3, and two of the second contact structures CT2 located adjacent to each other in the direction D2 may be separated from each other by a gap GP4. In other words, there is not any contact structure and/or contact disposed in the gap GP3, and there is not any contact structure or contact disposed in the gap GP4 also. In addition, because the first contact structures CT1 and the second contact structures CT2 are arranged misaligned with one another in the direction D1, one of the second contact structures CT2 may overlap the gap GP3 when viewed in the direction D1 and/or be aligned with the gap GP3 in the direction D1, and one of the first contact structures CT1 may overlap the gap GP4 when viewed in the direction D1 and/or be aligned with the gap GP4 in the direction D1. In some embodiments, a distance DS1 between two of the source contacts 60S disposed in each first contact structure CT1 and located adjacent to each other in the direction D2 may be less than a length of the gap GP3 in the direction D2, and the length of the gap GP1 in the direction D2 may be less than the length of the gate GP3 in the direction D2. A distance DS2 between two of the drain contacts 60D disposed in each second contact structure CT2 and located adjacent to each other in the direction D2 may be less than a length of the gap GP4 in the direction D2, and the length of the gap GP2 in the direction D2 may be less than the length of the gate GP4 in the direction D2.

In some embodiments, one of the drain silicide patterns 50D may overlap the gap GP1 and two of the source silicide patterns 50S located adjacent to each other and connected with the gap GP1 when viewed in the direction D1, one of the source silicide patterns 50S may overlap the gap GP2 and two of the drain silicide patterns 50D located adjacent to each other and connected with the gap GP2 when viewed in the direction D1, and each of the first contact structures CT1 and each of the second contact structures CT2 may not overlap when viewed in the direction D1, but not limited thereto. Additionally, in some embodiments, a distance between the gate structure 20 and one of the source silicide patterns 50S in the direction D1 (such as a distance DS11 illustrated in FIG. 1) may be substantially equal to a distance between the gate structure 20 and one of the drain silicide patterns 50D in the direction D1 (such as a distance DS12 illustrated in FIG. 1). For instance, the distance DS11 may be substantially equal to the distance DS12 with a tolerance of ±10% or a tolerance of +5%, but not limited thereto. However, the relative relationship between the distance DS11 and the distance DS12 may be adjusted in accordance with different product specifications, and the distance DS11 may be different from the distance DS12 in some embodiments accordingly.

Figure 3:
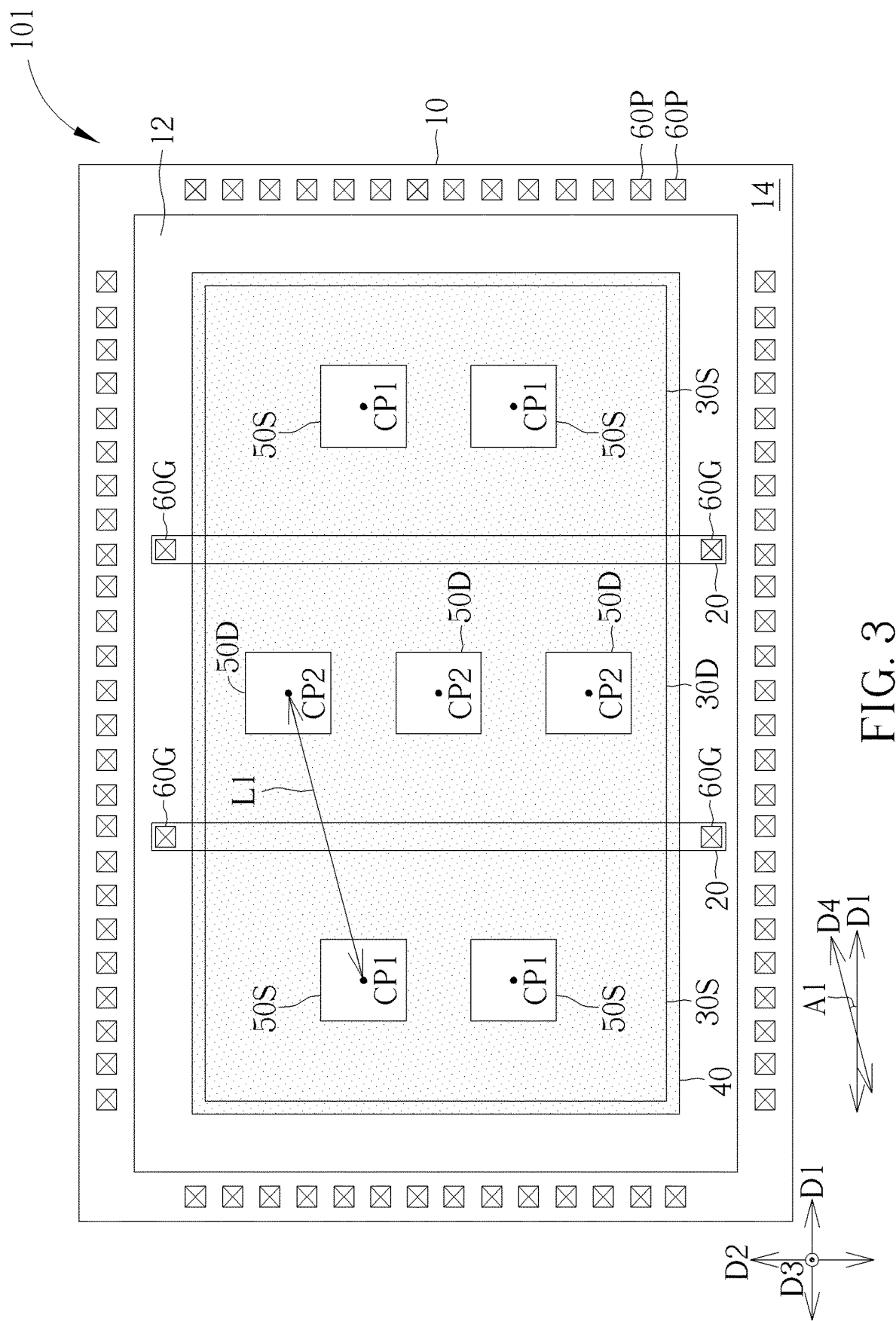
FIG. 3 is a schematic drawing illustrating an electrostatic discharge protection device according to the first embodiment of the present invention, which mainly shows the relative disposition relationship between source silicide patterns and drain silicide patterns.

Please refer to FIG. 1 and FIG. 3. FIG. 3 is a schematic drawing illustrating the ESD protection device according to the first embodiment of the present invention, which mainly shows the relative disposition relationship between the source silicide patterns and the drain silicide patterns, and the first contact structures CT1 and the second contact structures CT2 described above are not illustrated in FIG. 3. As shown in FIG. 1 and FIG. 3, in the top view diagram of the ESD protection device 101, a center point CP1 of one of the source silicide patterns 50S and a center point CP2 of one of the drain silicide patterns 50D may be located on a straight line L1 extending in a first oblique direction (such as a direction D4 shown in FIG. 3), the direction D4 is not parallel with the direction D1, and the direction D4 is not parallel with the direction D2. For example, an included angle A1 between the direction D4 and the direction D1 may be greater than 0 degree and less than 90 degrees, but not limited thereto. In addition, the center point CP1 and the center point CP2 described above may be a geometric center of the source silicide pattern 50S and a geometric center of the drain silicide pattern 50D, respectively, in the top view diagram of the ESD protection device.

Figure 4:
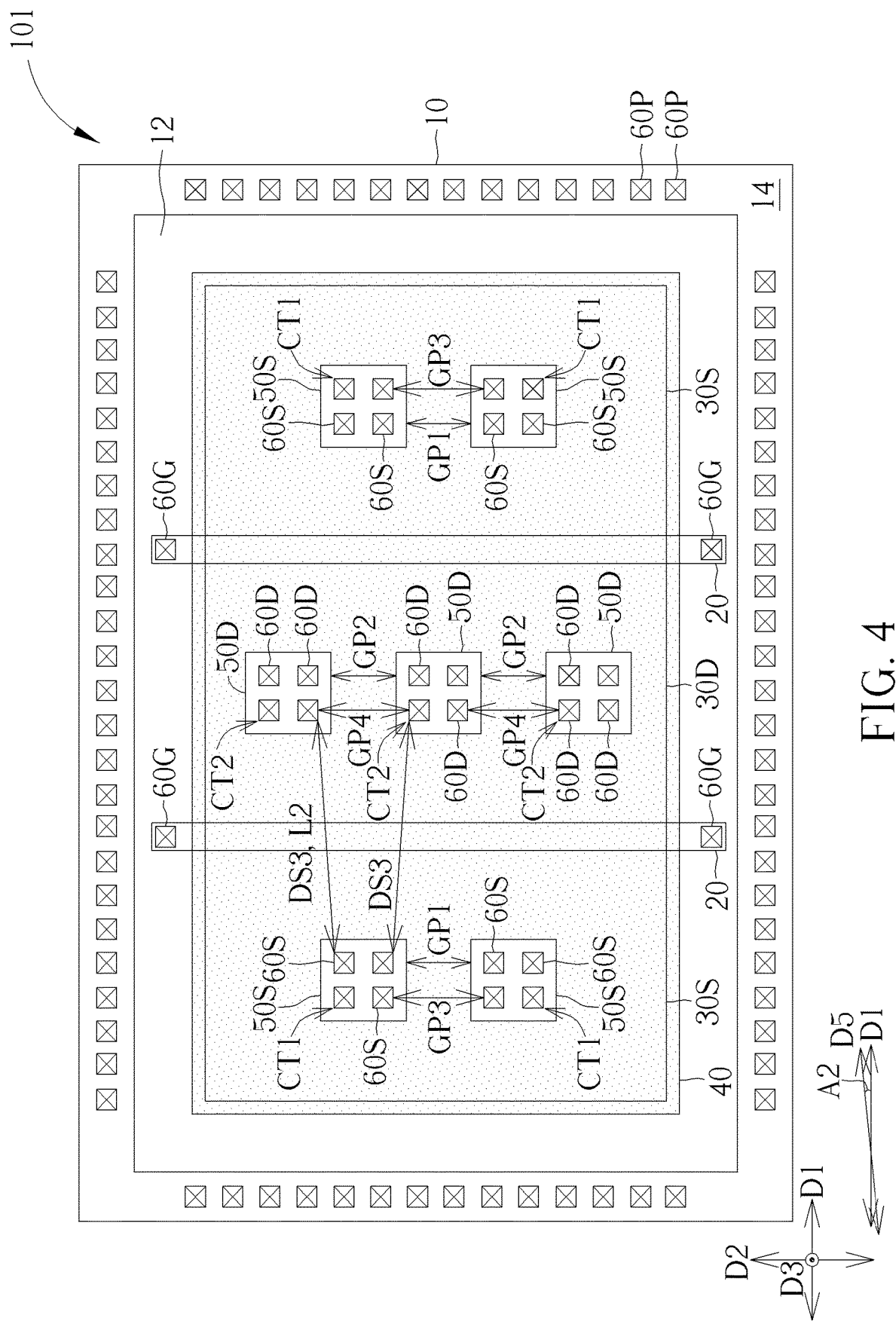
FIG. 4 is a schematic drawing illustrating an electrostatic discharge protection device according to the first embodiment of the present invention, which mainly shows the relative disposition relationship between source contacts and drain contacts.

Please refer to FIG. 4. FIG. 4 is a schematic drawing illustrating the ESD protection device according to the first embodiment of the present invention, which mainly shows the relative disposition relationship between source contacts and drain contacts. As shown in FIG. 4, in the top view diagram of the ESD protection device 101, a length of a straight line L2 connected with one of the source contacts 60S and one of the drain contacts 60D may be equal to the shortest distance between the source contact 60S and the drain contact 60D (such as a distance DS3 illustrated in FIG. 4), and the straight line L2 may extend in a second oblique direction (such as a direction D5 shown in FIG. 4). The direction D5 is not parallel with the direction D1, and the direction D5 is not parallel with the direction D2. For example, an included angle A2 between the direction D5 and the direction D1 may be greater than 0 degree and less than 90 degrees, but not limited thereto.

Figure 5:
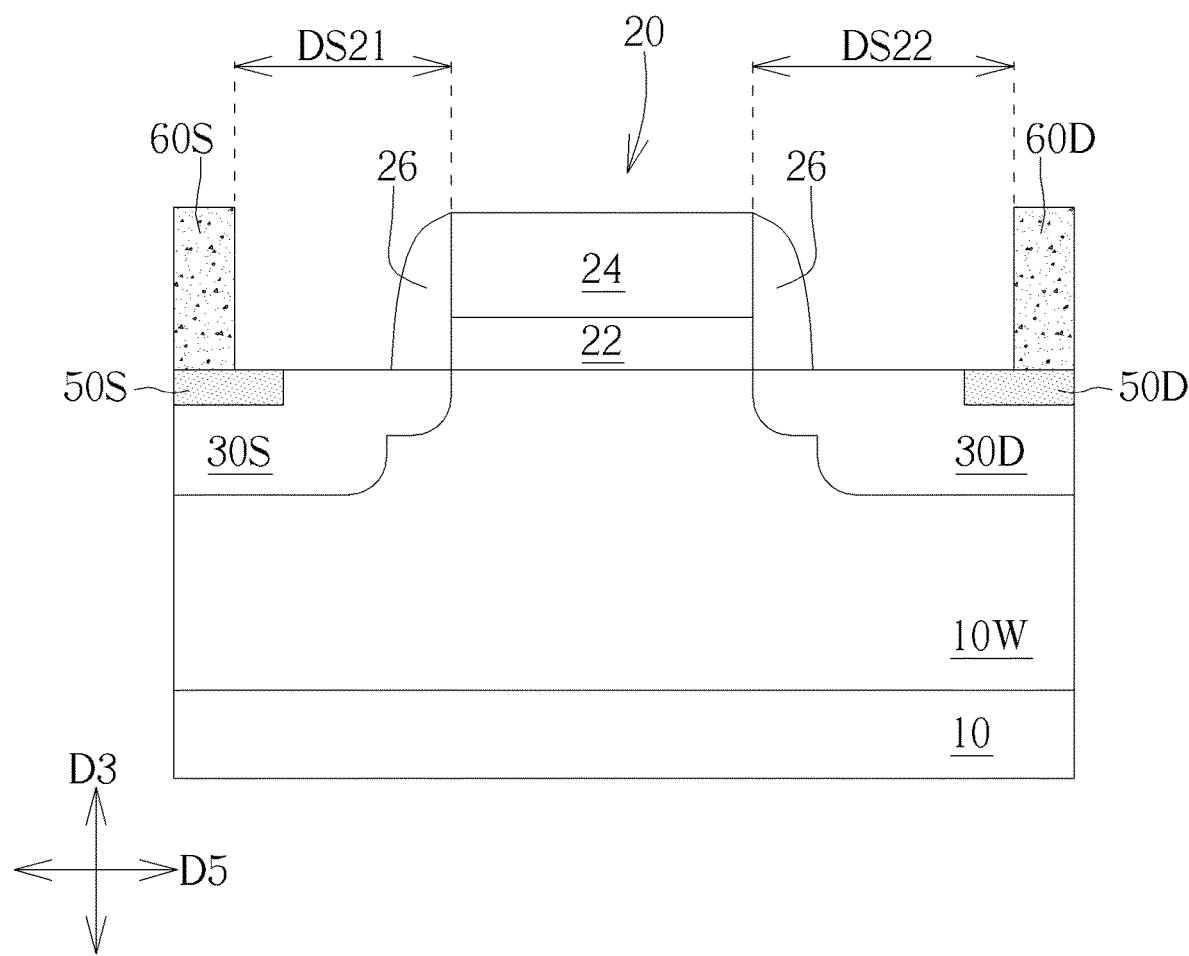
FIG. 5 is a schematic cross-sectional drawing illustrating a part of the electrostatic discharge protection device according to the first embodiment of the present invention.

Please refer to FIG. 1, FIG. 4, and FIG. 5. FIG. 5 is a schematic cross-sectional drawing illustrating a part of the ESD protection device according to the first embodiment of the present invention, such as a cross-sectional diagram taken along a line parallel with the direction D5, but not limited thereto. As shown in FIG. 1, FIG. 4, and FIG. 5, with the source silicide patterns 50S and the drain silicide patterns 50D arranged misaligned with one another and/or with the first contact structures CT1 and the second contact structures CT2 arranged misaligned with one another, the shortest distance between the source contact 60S and the drain contact 60D (such as the distance DS3 illustrated in FIG. 4) may be increased. Accordingly, a distance DS21 between the source contact 60S and the gate structure 20 in the direction D5 and a distance DS22 between the drain contact 60D and the gate structure 20 in the direction D5 may be increased, and a resistance of a ballast resistor formed with the material between the source contact 60S and the gate structure 20 (such as the source doped region 30S and/or the source silicide pattern 50S) and/or a resistance of a ballast resistor formed with the material between the drain contact 60D and the gate structure 20 (such as the drain doped region 30D and/or the drain silicide pattern 50D) may be increased for improving the electrical performance of the ESD protection device.

Specifically, in some embodiments, the semiconductor substrate 10 may include a silicon substrate, a silicon germanium substrate, or a semiconductor substrate formed with other suitable materials, and the ESD protection device 101 may further include a well region 10W disposed in the semiconductor substrate 10. The well region 10W may be a doped well region with a first conductivity type, and the source doped region 30S and the drain doped region 30D may be doped regions with a second conductivity type complementary to the first conductivity type. Therefore, a parasite bipolar junction transistor (BJT) may be formed with the source doped region 30S, the well region 10W, and the drain doped region 30D. For instance, the well region 10W may be a p-type well region, and the source doped region 30S and the drain doped region 30D may be n-type doped regions, but no limited thereto. The resistance of the ballast resistor described above may be increased by increasing the distance DS21 and/or the distance DS22 described above, and the current path in the bipolar junction transistor may be moved downwards accordingly for improving the electrostatic discharge (ESD) capability and electrical over stress (EOS) capability.

In some embodiments, the ESD protection device 101 may further include a spacer structure 26 disposed on a sidewall of the gate structure 20, and the gate structure 20 may include a gate dielectric layer 22 and a gate electrode 24 disposed on the gate dielectric layer 22. The spacer structure 26 may include a single layer or multiple layers of insulation materials, such as silicon oxide, silicon nitride, or other suitable insulation materials. The gate dielectric layer 22 may include high dielectric constant (high-k) dielectric material or other suitable dielectric materials, and the gate electrode 24 may include a non-metallic electrically conductive material (such as doped polysilicon) or a metallic electrically conductive material, but not limited thereto. In addition, the source silicide pattern 50S and the drain silicide pattern 50D may include cobalt-silicide, nickel-silicide, or other suitable electrically conductive metal silicide materials. The source contact 60S and the drain contact 60D may include a barrier layer (not illustrated) and a low resistivity material (not illustrated) disposed on the barrier layer, but not limited thereto. The low resistivity material described above may include a material with relatively lower electrical resistivity, such as copper, aluminum, tungsten, and so forth, and the barrier layer described above may include titanium nitride, tantalum nitride, or other suitable electrically conductive barrier materials, but not limited thereto.

As shown in FIG. 1 and FIG. 5, each of the source silicide patterns 50S is separated from the gate structure 20 and the spacer structure 26, and each of the drain silicide patterns 50D is separated from the gate structure 20 and the spacer structure 26. In some embodiments, the ESD protection device 101 may further include a silicide block pattern 40 disposed on the semiconductor substrate 10, the source silicide patterns 50S may be separated from one another by the silicide block pattern 40, and the drain silicide patterns 50D may be separated from one another by the silicide block pattern 40. In some embodiments, in the top view diagram of the ESD protection device, each of the source silicide patterns 50S and each of the drain silicide patterns 50D may be surrounded by the silicide block pattern 40. The locations and shapes of each source silicide pattern 50S and each drain silicide pattern 50D may be defined by the silicide block pattern 40. In some embodiments, the silicide block pattern 40 may be formed with an insulation hard mask. In some embodiments, the silicide block pattern 40 may be formed with a photoresist material and may be removed after the source silicide patterns 50S and the drain silicide patterns 50D are formed.

As shown in FIG. 1, in some embodiments, the ESD protection device 101 may include a plurality of the gate structures 20 and a plurality of the source doped regions 30S, and the ESD protection device 101 may further include an isolation structure 12, a doped region 14, contacts 60P, and gate contacts 60G. For example, the ESD protection device 101 may include two gate structures 20 disposed on the semiconductor substrate 10, and each of the gate structures 20 may be elongated in the direction D2. The drain doped region 30D, the drain silicide patterns 50D, and the second contact structures CT2 may be disposed between the two gate structures 20 in the direction D1. The two source doped regions 30S, the corresponding source silicide patterns 50S and the corresponding first contact structures CT1 may be disposed at the relatively outer sides of the two gate structures 20 in the direction D1, respectively.

In some embodiments, the doped region 14 may be a doped region with the first conductivity type, such as a p-type doped region, but not limited thereto. The isolation structure 12 may include a field oxide layer, a trench isolation structure, or other suitable insulating isolation structures. The isolation structure 12 may surround the source doped regions 30S and the drain doped region 30D, and the isolation structure 12 may be disposed between the doped region 14 and the source doped region 30S and disposed between the doped region 14 and the drain doped region 30D. The gate contacts 60G may be disposed on the gate structures 20 for being electrically connected with the gate structures 20, and the contacts 60P may be disposed on the doped region 14. In some embodiments, the material composition of the gate contacts 60G and the contacts 60P may be similar to that of the source contacts 60S and the drain contacts 60D described above, but not limited thereto. It is worth noting that the layout design of the ESD protection device 101 in the present invention is not limited to the layout design illustrated in FIG. 1 and may be further modified according to some design considerations.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
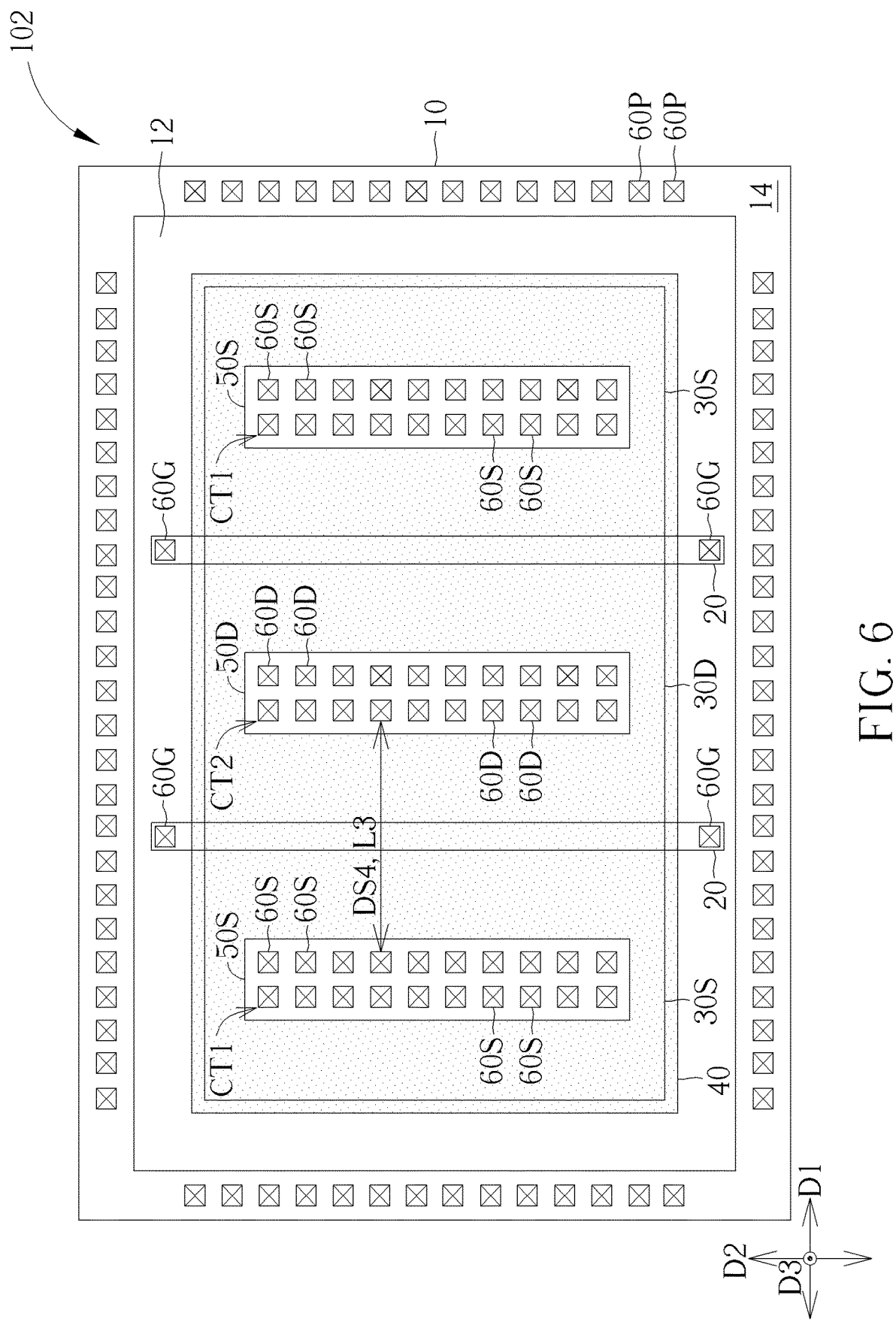
FIG. 6 is a schematic drawing illustrating an electrostatic discharge protection device according to a second embodiment of the present invention.

Please refer to FIG. 6. FIG. 6 is a schematic drawing illustrating an ESD protection device 102 according to a second embodiment of the present invention. As shown in FIG. 6, in the ESD protection device 102, there may be only one first contact structure CT1 and only one second contact structure CT2 disposed on the two opposite sides of the gate structure 20 in the direction D1, respectively, and the first contact structure CT1 and the second contact structure CT2 may be disposed corresponding to each other, overlap, and/or aligned with each other when viewed in the direction D1. In other words, in this embodiment, the first contact structure CT1 and the second contact structure CT2 are not arranged misaligned with each other in the direction D1. Comparatively, the source silicide pattern 50S and the drain silicide pattern 50D in this embodiment may be disposed corresponding to each other, overlap, and/or aligned with each other when viewed in the direction D1. Therefore, the source silicide pattern 50S and the drain silicide pattern 50D are not arranged misaligned with each other in the direction D1, also. In this embodiment, a length of a straight line L3 connected with one of the source contacts 60S and one of the drain contacts 60D may be equal to the shortest distance between the source contact 60S and the drain contact 60D (such as a distance DS4 illustrated in FIG. 6), and the straight line L3 extends in the direction D1.

Please refer to FIG. 6 and FIG. 4. As shown in FIG. 6 and FIG. 4, when the area occupied by the ESD protection device 102 in the direction D3 is substantially equal to the area occupied by the ESD protection device 101 in the direction D3, the shortest distance between the source contact 60S and the drain contact 60D in the ESD protection device 101 (such as the distance DS3) may be greater than the shortest distance between the source contact 60S and the drain contact 60D in the ESD protection device 102 (such as the distance DS4). Therefore, the ESD protection device 101 may have better electrical performance (such as better ESD capability and better EOS capability). Relatively, when the distance DS3 is substantially equal to the distance DS4, the related electrical performance (such as the ESD capability and the EOS capability) of the ESD protection device 101 may be similar to that of the ESD protection device 102, but the area occupied by the ESD protection device 101 may be relatively smaller (the length in the direction D1 may be reduced, for example) because of the source silicide patterns 50S and the drain silicide patterns 50D arranged misaligned with one another and/or the first contact structures CT1 and the second contact structures CT2 arranged misaligned with one another, and the purpose of reducing the occupied area may be achieved accordingly.

Figure 7:
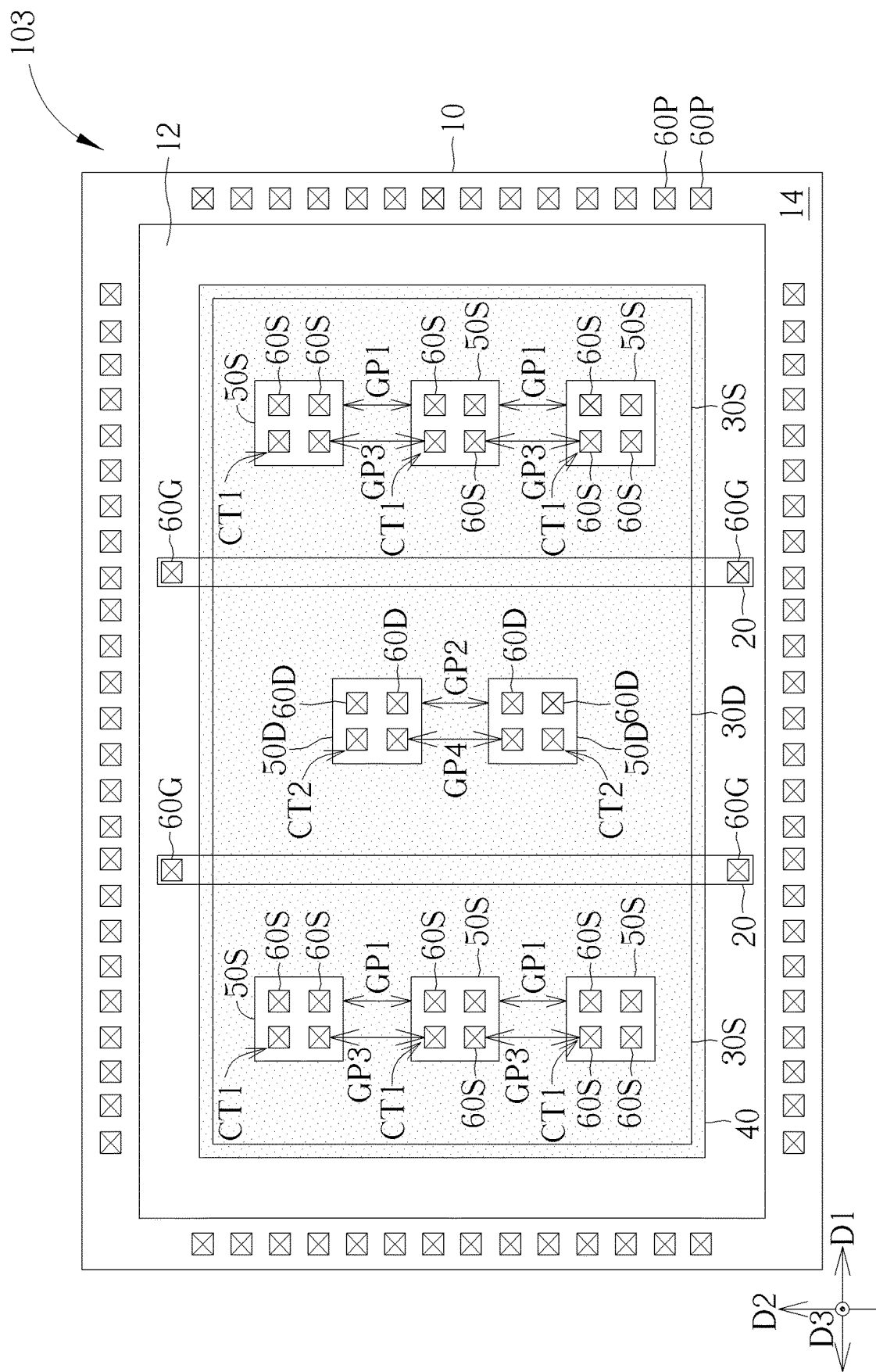
FIG. 7 is a schematic drawing illustrating an electrostatic discharge protection device according to a third embodiment of the present invention.

Please refer to FIG. 7. FIG. 7 is a schematic drawing illustrating an ESD protection device 103 according to a third embodiment of the present invention. As shown in FIG. 7, in the ESD protection device 103, the amount of the source silicide patterns 50S and the amount of the drain silicide patterns 50D located at two opposite sides of the same gate structure 20 in the direction D1 may be different from each other, and the amount of the first contact structures CT1 and the amount of the second contact structures CT2 located at two opposite sides of the same gate structure 20 in the direction D1 may be different from each other. For example, as shown in FIG. 7, the amount of the drain silicide patterns 50D may be less than the amount of the source silicide patterns 50S located at another side of the same gate structure 20 in the direction D1, and the amount of the corresponding second contact structures CT2 may be less than the amount of the first contact structures CT1. Therefore, the integrated length of the source silicide patterns 50S in the direction D2 may be greater than the integrated length of the drain silicide patterns 50D in the direction D2, and the integrated length of the first contact structures CT1 in the direction D2 may be greater than the integrated length of the second contact structures CT2 in the direction D2. Comparatively, in some embodiments (such as the ESD protection device 101 in FIG. 1 described above), the amount of the source silicide patterns 50S may be less than the amount of the drain silicide patterns 50D located at another side of the same gate structure 20 in the direction D1, and the amount of the corresponding first contact structures CT1 may be less than the amount of the second contact structures CT2.

Figure 8:
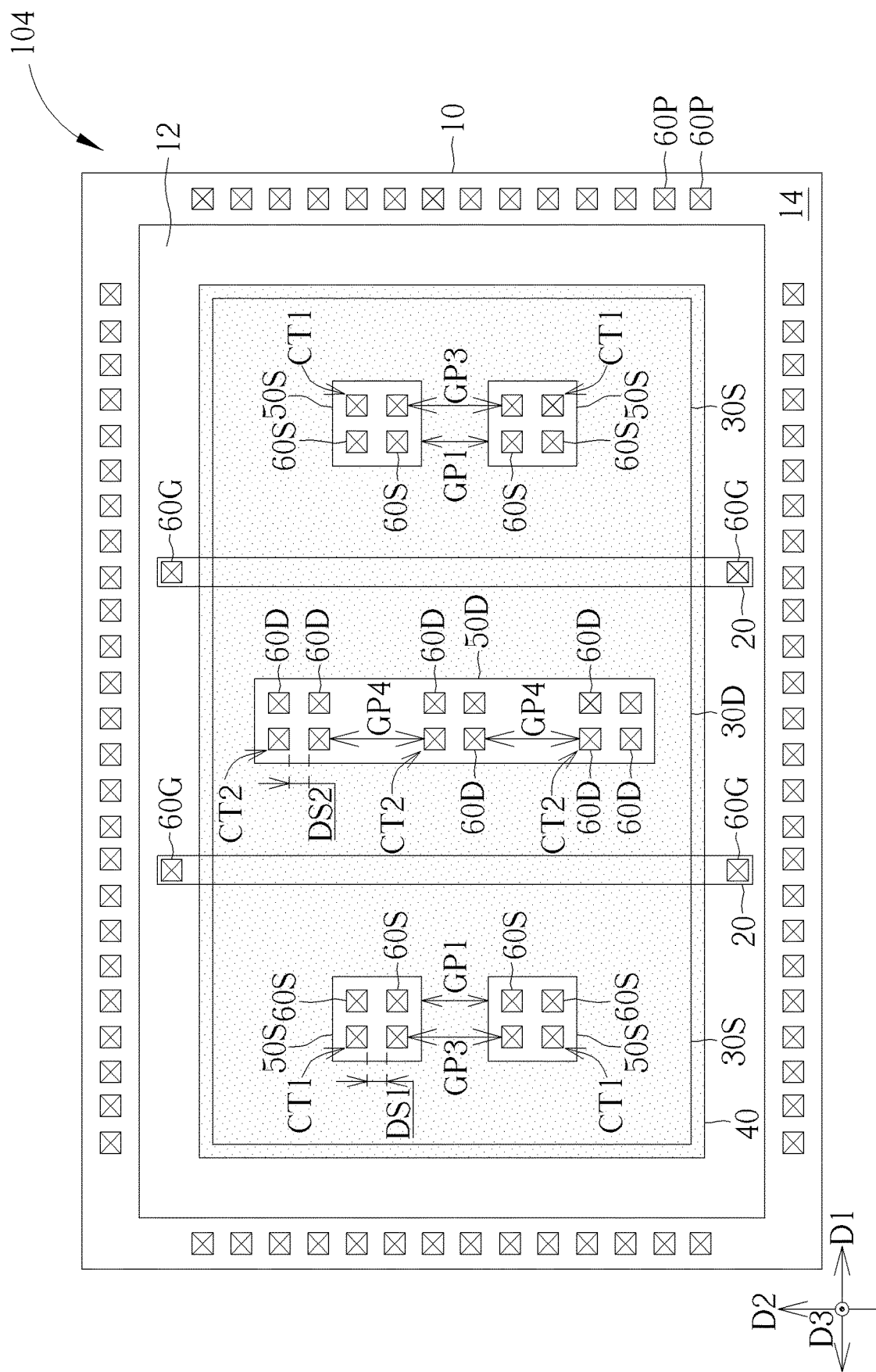
FIG. 8 is a schematic drawing illustrating an electrostatic discharge protection device according to a fourth embodiment of the present invention.

Please refer to FIG. 8. FIG. 8 is a schematic drawing illustrating an ESD protection device 104 according to a fourth embodiment of the present invention. As shown in FIG. 8, the ESD protection device 104 may include only one drain silicide pattern 50D disposed between the two gate structures 20 in the direction D1, and the second contact structures CT2 may be disposed on the same drain silicide pattern 50D. In this embodiments, the length of the drain silicide pattern 50D in the direction D2 is greater than the length of each source silicide pattern 50S in the direction D2 and the integrated length of the source silicide patterns 50S in the direction D2, but a certain degree of the ESD capability and the EOS capability improvement can still be achieved and/or the area occupied by the ESD protection device may be reduced by the first contact structures CT1 and the second contact structures CT2 arranged misaligned with one another.

Figure 9:
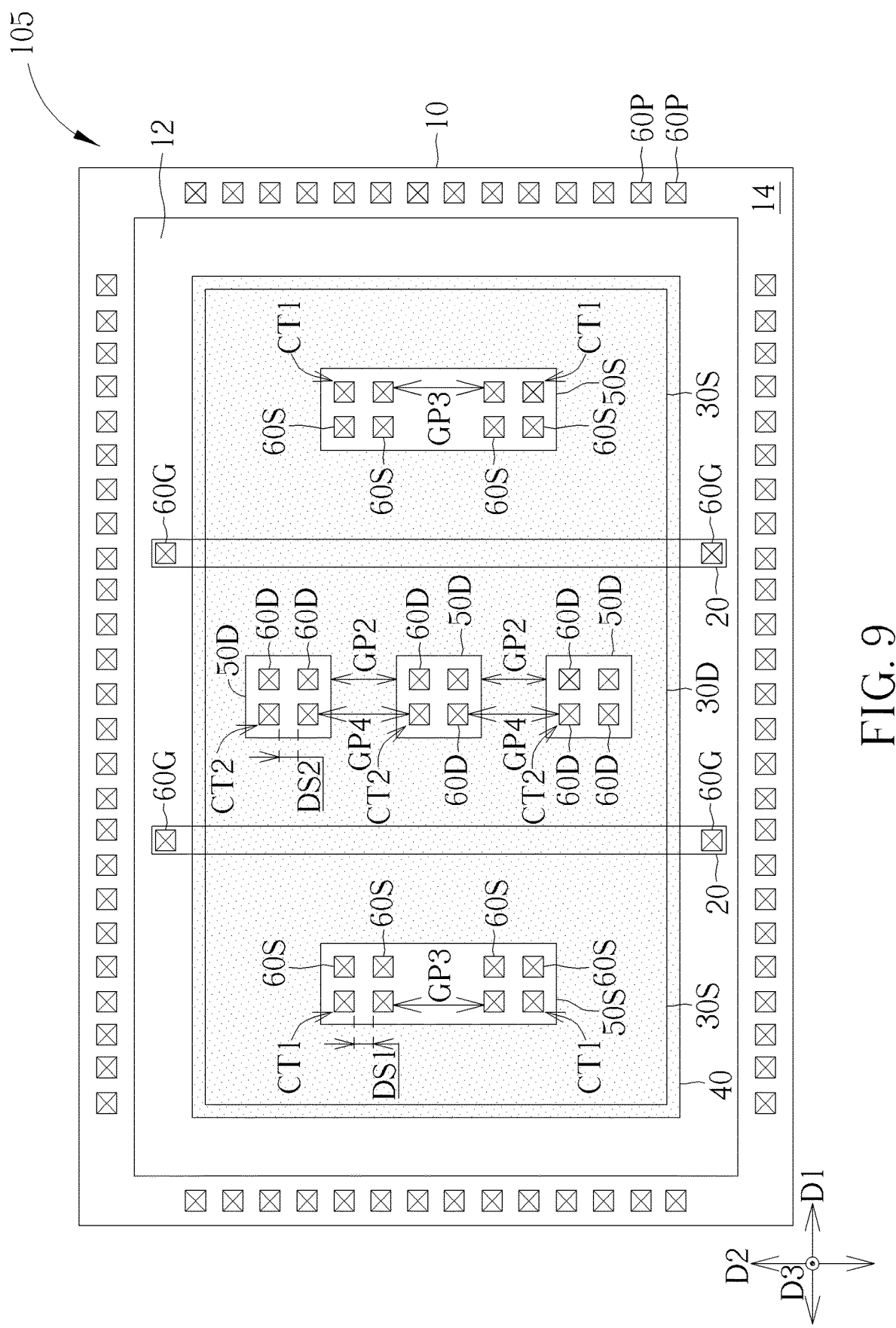
FIG. 9 is a schematic drawing illustrating an electrostatic discharge protection device according to a fifth embodiment of the present invention.

Please refer to FIG. 9. FIG. 9 is a schematic drawing illustrating an ESD protection device 105 according to a fifth embodiment of the present invention. As shown in FIG. 9, in the ESD protection device 105, there may be only one source silicide pattern 50S disposed on each source doped region 30S, and the first contact structures CT1 may be disposed on the same source silicide pattern 50S. In this embodiments, the length of each source silicide pattern 50S in the direction D2 is greater than the length of each drain silicide pattern 50D in the direction D2, and the source silicide pattern 50S may overlap the two gaps GP2 and the drain silicide pattern 50D located between the two gaps GP2, but a certain degree of the ESD capability and the EOS capability improvement can still be achieved and/or the area occupied by the ESD protection device may be reduced by the first contact structures CT1 and the second contact structures CT2 arranged misaligned with one another.

To summarize the above descriptions, according to the ESD protection device in the present invention, the source silicide patterns and the drain silicide patterns arranged misaligned with one another and/or the first contact structures and the second contact structures arranged misaligned with one another may be used to increase the distance between the gate structure and the first contact structure and/or the distance between the gate structure and the second contact structure. The ESD capability and the EOS capability may be enhanced accordingly, and/or the area occupied by the ESD protection device may be reduced relatively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrostatic discharge (ESD) protection device, comprising:
   a semiconductor substrate;
   a first gate structure and a second gate structure, wherein the first gate structure and the second gate structure are disposed on the semiconductor substrate;
   a first source doped region, a second source doped region, and a drain doped region, wherein the first source doped region, the second source doped region, and the drain doped region are disposed in the semiconductor substrate, the first source doped region and the drain doped region are located at two opposite sides of the first gate structure in a first direction, respectively, and the second source doped region and the drain doped region are located at two opposite sides of the second gate structure in the first direction, respectively;
   first source silicide patterns disposed on the first source doped region, wherein the first source silicide patterns are arranged in a second direction and separated from one another;
   second source silicide patterns disposed on the second source doped region, wherein the second source silicide patterns are arranged in the second direction and separated from one another;
   drain silicide patterns disposed on the drain doped region, wherein the drain silicide patterns are arranged in the second direction and separated from one another, the first source silicide patterns and the drain silicide patterns are arranged misaligned with one another in the first direction, and the second source silicide patterns and the drain silicide patterns are arranged misaligned with one another in the first direction;
   a silicide block pattern disposed on the semiconductor substrate, wherein the first source silicide patterns are separated from one another by the silicide block pattern, the drain silicide patterns are separated from one another by the silicide block pattern, and in a top view diagram of the ESD protection device, each of the first source silicide patterns and each of the drain silicide patterns are surrounded by the silicide block pattern; and
   first source contacts disposed on the first source silicide patterns and separated from one another, wherein at least four of the first source contacts are disposed on and directly contact one of the first source silicide patterns, an amount of the drain silicide patterns surrounded by the silicide block pattern is greater than an amount of the first source silicide patterns surrounded by the silicide block pattern, and the at least four first source contacts are arranged in an array configuration with multiple columns and multiple rows in the top view diagram of the ESD protection device,
   wherein two of the first source silicide patterns located adjacent to each other are separated by a first gap, and one of the drain silicide patterns overlaps the two of the first source silicide patterns located adjacent to each other and the first gap when viewed in the first direction,
   wherein two of the second source silicide patterns located adjacent to each other are separated by a second gap, and the one of the drain silicide patterns overlaps the two of the second source silicide patterns located adjacent to each other and the second gap when viewed in the first direction.

2. The ESD protection device according to claim 1, wherein two of the drain silicide patterns located adjacent to each other are separated by a third gap, and one of the first source silicide patterns overlaps the third gap when viewed in the first direction.

3. The ESD protection device according to claim 1, further comprising:
   a spacer structure disposed on a sidewall of the first gate structure, wherein the first source silicide patterns are separated from the first gate structure and the spacer structure.

4. The ESD protection device according to claim 1, wherein the silicide block pattern is formed with an insulation hard mask.

5. The ESD protection device according to claim 1, wherein in the top view diagram of the ESD protection device, a center point of one of the first source silicide patterns and a center point of one of the drain silicide patterns are located on a straight line extending in an oblique direction, the oblique direction is not parallel with the first direction, and the oblique direction is not parallel with the second direction.

6. The ESD protection device according to claim 1, further comprising:
   drain contacts disposed on the drain silicide patterns, wherein in the top view diagram of the ESD protection device, a length of a straight line connected with one of the first source contacts and one of the drain contacts is equal to the shortest distance between the first source contacts and the drain contacts, and the straight line extends in an oblique direction, wherein the oblique direction is not parallel with the first direction, and the second oblique direction is not parallel with the second direction.

7. The ESD protection device according to claim 1, wherein the first direction is orthogonal to the second direction.

8. The ESD protection device according to claim 1, wherein a distance between the first gate structure and one of the first source silicide patterns in the first direction is different from a distance between the first gate structure and one of the drain silicide patterns in the first direction.

9. The ESD protection device according to claim 1, wherein a distance between the first gate structure and one of the first source silicide patterns in the first direction is substantially equal to a distance between the first gate structure and one of the drain silicide patterns in the first direction.

10. An electrostatic discharge (ESD) protection device, comprising:
a semiconductor substrate;
a gate structure disposed on the semiconductor substrate;
a source doped region and a drain doped region disposed in the semiconductor substrate and located at two opposite sides of the gate structure in a first direction, respectively;
source silicide patterns disposed on the source doped region and separated from one another;
drain silicide patterns disposed on the drain doped region and separated from one another;
a silicide block pattern disposed on the semiconductor substrate, wherein the source silicide patterns are separated from one another by the silicide block pattern, the drain silicide patterns are separated from one another by the silicide block pattern, and in a top view diagram of the ESD protection device, each of the source silicide patterns and each of the drain silicide patterns are surrounded by the silicide block pattern;
first contact structures disposed on the source silicide patterns, wherein the first contact structures are arranged in a second direction and separated from one another, and each of the first contact structures is disposed on one of the source silicide patterns and comprises at least four source contacts separated from one another and directly contacting the one of the source silicide patterns; and
second contact structures disposed on the drain silicide patterns, wherein the second contact structures are arranged in the second direction and separated from one another, each of the second contact structures is disposed on one of the drain silicide patterns, and the first contact structures and the second contact structures are arranged misaligned with one another in the first direction,
wherein an amount of the drain silicide patterns surrounded by the silicide block pattern is greater than an amount of the source silicide patterns surrounded by the silicide block pattern, and the at least four source contacts of each of the first contact structures are arranged in an array configuration with multiple columns and multiple rows in the top view diagram of the ESD protection device,
wherein two of the source silicide patterns located adjacent to each other are separated by a first gap, and one of the drain silicide patterns overlaps the two of the source silicide patterns located adjacent to each other and the first gap when viewed in the first direction.

11. The ESD protection device according to claim 10, wherein two of the first contact structures located adjacent to each other are separated by a second gap, and one of the second contact structures overlaps the second gap when viewed in the first direction.

12. The ESD protection device according to claim 11, wherein a distance between the source contacts in the second direction is less than a length of the second gap in the second direction.

13. The ESD protection device according to claim 10, wherein two of the second contact structures located adjacent to each other are separated by a second gap, and one of the first contact structures overlaps the second gap when viewed in the first direction.

14. The ESD protection device according to claim 13, wherein each of the second contact structures comprises drain contacts separated from one another, and a distance between the drain contacts in the second direction is less than a length of the second gap in the second direction.

* * * * *